United States Patent
Ju et al.

(10) Patent No.: US 8,232,590 B2
(45) Date of Patent: Jul. 31, 2012

(54) NONVOLATILE MEMORY DEVICES

(75) Inventors: Byoungsun Ju, Seongnam-si (KR);
Sunggil Kim, Seoul (KR); Jintae Noh,
Suwon-si (KR); Siyoung Choi,
Seongnam-si (KR); Kihyun Hwang,
Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 12/829,689

(22) Filed: Jul. 2, 2010

(65) Prior Publication Data

US 2011/0001181 A1 Jan. 6, 2011

(30) Foreign Application Priority Data

Jul. 6, 2009 (KR) .................. 10-2009-0061292

(51) Int. Cl.
*H01L 29/788* (2006.01)
(52) U.S. Cl. ........................ 257/320; 257/321
(58) Field of Classification Search .................. 257/320, 257/321
See application file for complete search history.

(56) References Cited

U.S. PATENT DOCUMENTS

| 5,866,930 | A | 2/1999 | Saida et al. | |
|---|---|---|---|---|
| 6,166,401 | A | 12/2000 | Forbes | |
| 6,309,907 | B1 | 10/2001 | Forbes et al. | |
| 6,835,638 | B1 | 12/2004 | Forbes et al. | |
| 6,936,849 | B1 | 8/2005 | Forbes et al. | |
| 7,692,234 | B2 * | 4/2010 | Adachi et al. | 257/316 |
| 7,951,670 | B2 * | 5/2011 | Huang et al. | 438/257 |
| 2007/0190726 | A1 * | 8/2007 | Song et al. | 438/264 |
| 2008/0149991 | A1 * | 6/2008 | Saitoh et al. | 257/316 |

* cited by examiner

*Primary Examiner* — David Vu
*Assistant Examiner* — Brandon Fox
(74) *Attorney, Agent, or Firm* — Myers Bigel Sibley & Sajovec

(57) ABSTRACT

Provided is a nonvolatile memory device. The nonvolatile memory device includes: a tunnel insulation layer on a semiconductor substrate; a floating gate electrode including a bottom gate electrode doped with carbon and contacting the tunnel insulation layer and a top gate electrode on the bottom gate electrode; a gate interlayer insulation layer on the floating gate electrode; and a control gate electrode on the gate interlayer insulation layer.

9 Claims, 16 Drawing Sheets

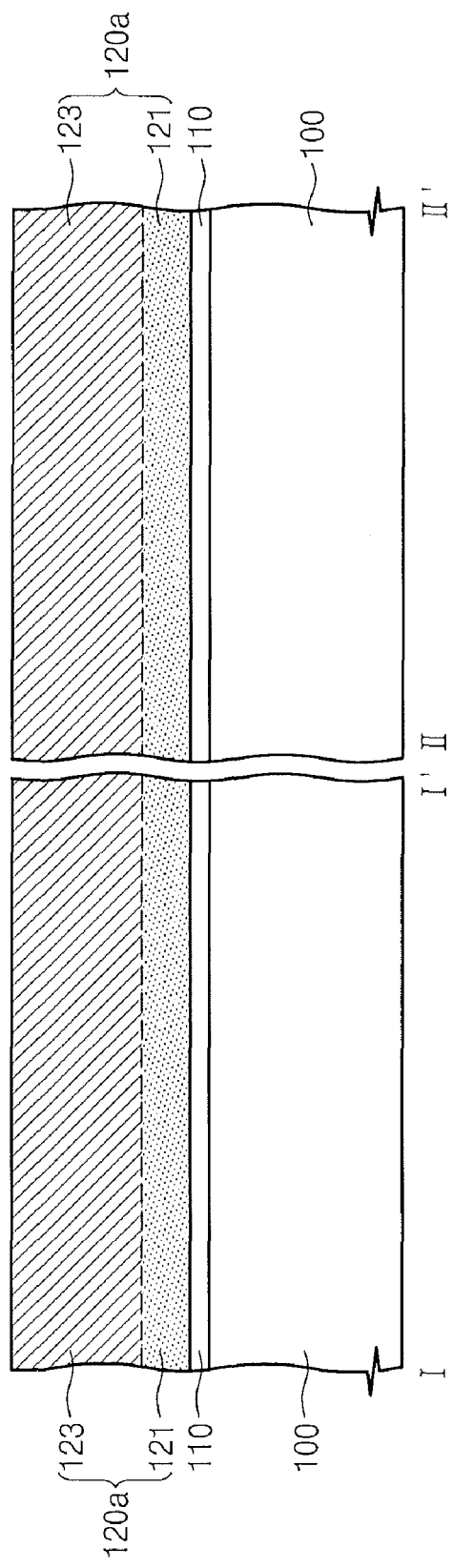

NONVOLATILE MEMORY DEVICES

CROSS-REFERENCE TO RELATED APPLICATIONS

This U.S. non-provisional patent application claims priority under 35 U.S.C. §119 of Korean Patent Application No. 10-2009-0061292, filed on Jul. 6, 2009, the entire contents of which are hereby incorporated by reference as if set forth fully herein.

BACKGROUND

The present disclosure herein relates to nonvolatile memory devices, and more particularly, to nonvolatile memory devices.

A nonvolatile memory device retains stored data even when power supply is cut off and includes a Programmable ROM (PROM), an Erasable PROM (EPROM), an Electrically EPROM (EEPROM), and a Flash Memory Device, among others. Among them, the flash memory device electrically programs and erases data using Fowler-Nordheim tunneling or channel hot electron injection. A flash memory device may have memory cells of various types and may be classified into a NAND type and a NOR type based on a cell array structure. In addition, the flash memory device may be divided into floating gate type flash memory devices and charge trap type flash memory devices according to kinds of a memory storage layer constituting a unit cell.

SUMMARY

The present disclosure provides embodiments of nonvolatile memory devices capable of improving reliability.

Embodiments of the present invention include nonvolatile memory devices that include a tunnel insulation layer on a semiconductor substrate and a floating gate electrode. The floating gate electrode may include a bottom gate electrode doped with carbon and contacting the tunnel insulation layer and a top gate electrode on the bottom gate electrode. The memory device may further include a gate interlayer insulation layer on the floating gate electrode and a control gate electrode on the gate interlayer insulation layer.

In some embodiments, the carbon doped in the bottom gate electrode includes a concentration range of 0.1% to 20%. Some embodiments provide that the carbon doped in the bottom gate electrode has at least one of a uniform doping concentration or a uniform concentration gradient.

In some embodiments, a first carbon doping concentration at a portion adjacent the tunnel insulation layer is higher than a second carbon doping at a portion adjacent the top gate electrode, in the bottom gate electrode. Some embodiments provide that a first carbon doping concentration in the bottom gate electrode is higher than a second carbon doping in the top gate electrode.

Some embodiments provide that the gate interlayer insulation layer is spaced apart from the bottom gate electrode. Some embodiments include multiple device isolation layers defining an active region and protruding from a surface of the semiconductor substrate. The bottom gate electrode may be disposed between ones of the device isolation layers. In some embodiments, a top of the bottom gate electrode is disposed being lower than or identical to a top of one of the plurality of device isolation layers that is adjacent a sidewall of the bottom gate electrode. Some embodiments provide that a portion of the control gate electrode between the bottom gate electrodes has a lower bottom than the top of the bottom gate electrode.

Some embodiments of the present invention include memory cards that include a nonvolatile memory device as described herein and a memory controller that is configured to controlling general data exchanges between a host and the nonvolatile memory device.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 6 to 11 are sectional views taken along the lines I-I' and II-II' of FIG. 1 and illustrate a manufacturing method of a nonvolatile memory device sequentially according to some embodiments of the present invention;

DETAILED DESCRIPTION OF THE EMBODIMENTS

Figure 1:
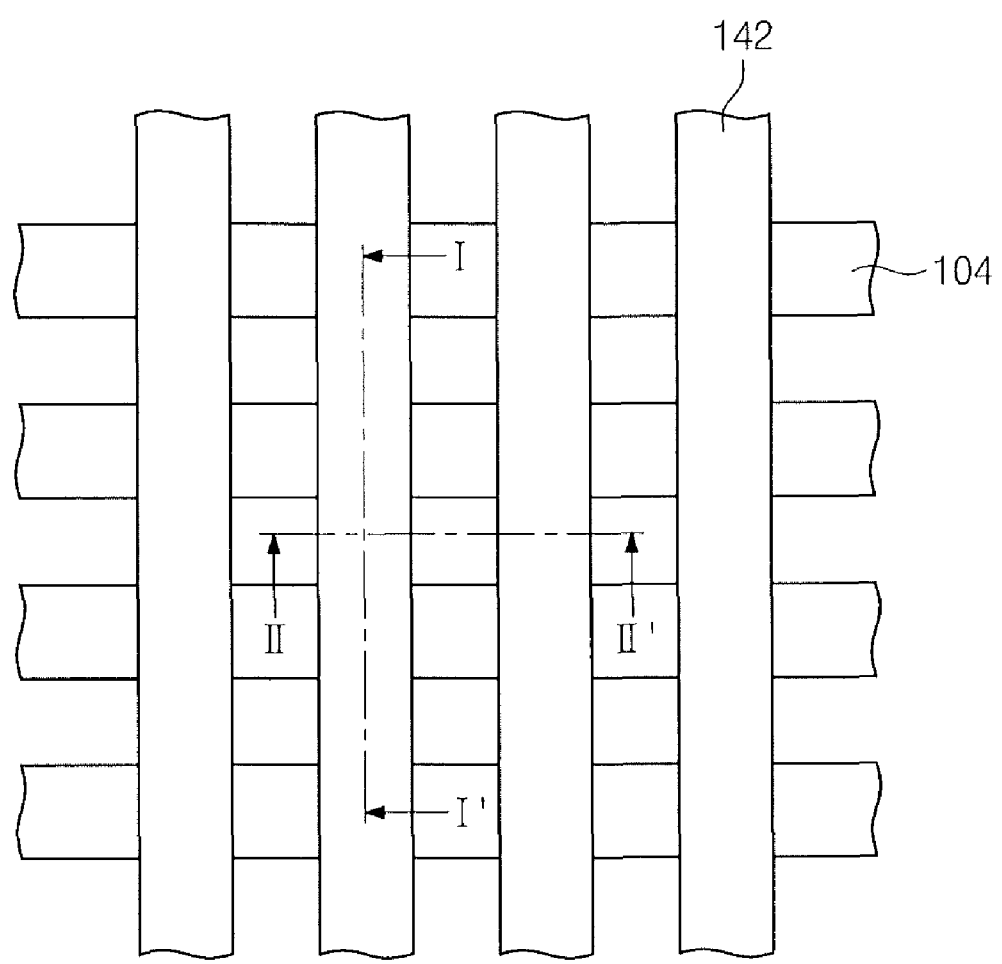
FIG. 1 is a plan view of a nonvolatile memory device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Hereinafter, a nonvolatile memory device according to embodiments of the inventive concept will be described in more detail with reference to the drawings.

Figure 2:
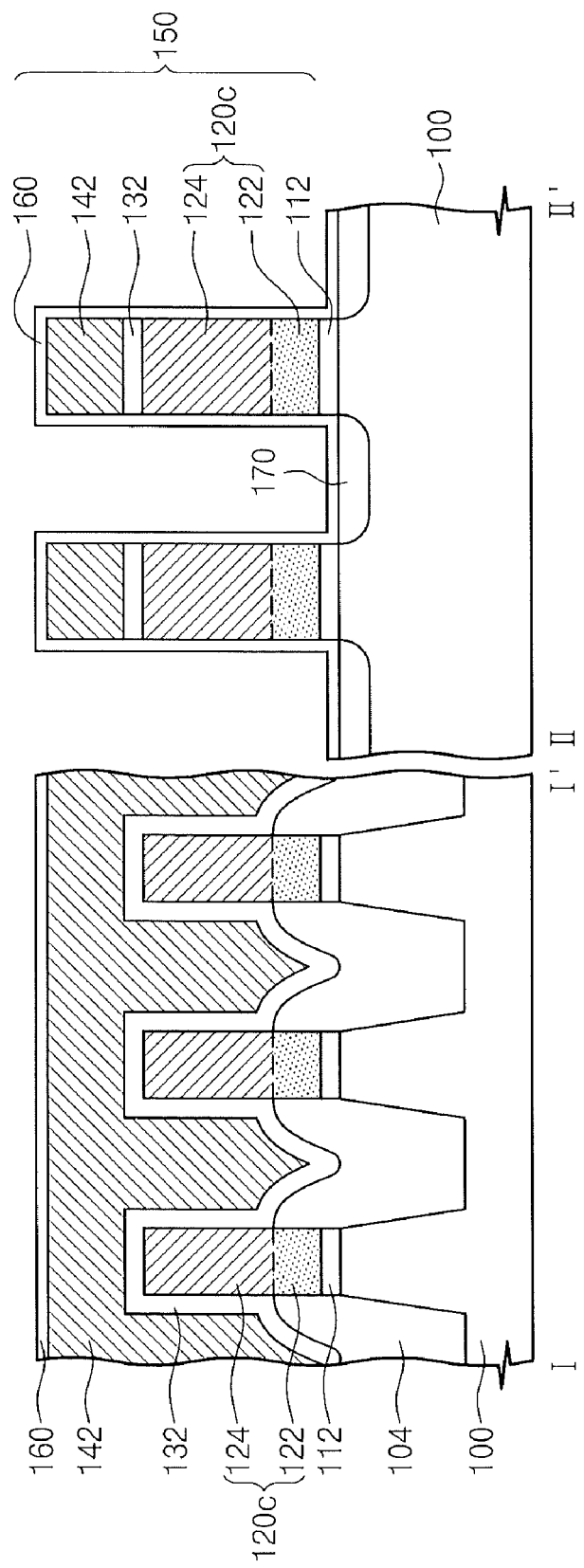
FIG. 2 is a sectional view of a nonvolatile memory device according to embodiments of the present invention and illustrates sections taken along the lines I-I' and II-II' of FIG. 1.

FIG. 1 is a plan view of a nonvolatile memory device according to some embodiments of the present invention. FIG. 2 is a sectional view of a nonvolatile memory device according to some embodiments of the present invention and illustrates sections taken along the lines I-I' and II-II' of FIG. 1.

Referring to FIGS. 1 and 2, provided is a semiconductor substrate 100 where an active region is defined by a device isolation layer 104. The semiconductor substrate 100 may be a bulk silicon substrate, a silicon on insulator (SOI) substrate, a germanium substrate, a germanium on insulator (GOI) substrate, a silicon-germanium substrate, or a substrate of an epitaxial thin layer formed through selective epitaxial growth (SEG).

The device isolation layer 104 may have a plane structure of a line form and may be an insulation layer filled in a trench formed in the semiconductor substrate 100. The device isolation layers 104 may be laterally spaced a predetermined interval apart from each other and may define active regions of a line pattern. In addition, the device isolation layer 104 may protrude from the surface of the semiconductor substrate 100 and the top of the device isolation layer 104 may have a recessed structure.

A gate structure 150 is disposed on the semiconductor substrate 100 having a defined active region. The gate structure 150 may include a tunnel insulation layer pattern 112, a floating gate electrode 120c, a gate interlayer insulation layer pattern 132, and a control gate electrode 142, which may be sequentially stacked on the semiconductor substrate 100.

The tunnel insulation layer pattern 112 may be formed on an active region surface of the semiconductor substrate 100 and the floating gate electrode 120c may be locally formed on a portion where the active region and the control gate electrode 142 intersect. The gate interlayer insulation layer pattern 132 and the control gate electrode 142 may cross over the active region on the floating gate electrode 120c. In more detail, the tunnel insulation layer pattern 112 may be thinly formed on the semiconductor substrate 100. During data storing and/or erasing of a nonvolatile memory device, charges may tunnel through the tunnel insulation layer pattern 112 through F-N tunneling and move to the semiconductor substrate 100 and/or the floating gate electrode 120c.

The floating gate electrode 120c may be formed of a polysilicon layer doped with an n-type or p-type impurity. The charges tunneling through the tunnel insulation layer pattern 112 may be accumulated on the floating gate electrode 120c. The floating gate electrode 120c may include a bottom gate electrode 122 contacting the top of the tunnel insulation layer pattern 112 and a top gate electrode 124 formed on the bottom gate electrode 122.

The floating gate electrode 120c may have a slant profile and accordingly, the width of the bottom gate electrode 122 may be greater than that of the top gate electrode 124. Then, in order to prevent the oxidization of the bottom of the floating gate electrode 120c contacting the tunnel insulation layer pattern 112, the bottom gate electrode 122 of the floating gate electrode 120c may be doped with carbon. The carbon doped bottom gate electrode 122 may contact the top of the tunnel insulation layer pattern 112 and both sidewalls of the bottom gate electrode 122 may contact the device isolation layer 104.

In addition, carbon doping concentration of the bottom gate electrode 122 may be greater than that of the top gate electrode 124. Some embodiments provide that the top gate electrode 124 may be doped with carbon. In such embodiments, the carbon doped polysilicon layer and the gate interlayer insulation layer pattern 132 may contact such that charge trap property of the floating gate electrode 120c and reliability of a nonvolatile memory device can be deteriorated. Accordingly, in some embodiments, the top gate electrode 124 may not be substantially doped with carbon. In order not to contact the carbon doped bottom gate electrode 122 and the gate interlayer insulation layer pattern 132, the top of the bottom gate electrode 122 may be lower than the top of the device isolation layer 104 protruding from the semiconductor substrate 100 and/or may be disposed on the same height as the top of the device isolation layer 104. That is, the top of the bottom gate electrode 122 may be lower or at substantially the same height as the top of the device isolation layer 104 adjacent the bottom gate electrode 122.

Some embodiments provide that a grain size of the carbon doped bottom gate electrode 122 is smaller than that of the top gate electrode 124. In addition, a grain size of the bottom gate electrode 122 may vary according to carbon doping concentration. For example, the bottom gate electrode 122 may have carbon doping concentration ranging from about 0.1% to about 20%.

Then, carbon in the bottom gate electrode 122 may have uniform doping concentration or concentration gradient. For example, carbon doping concentration may be decreased or increased as it approaches from the tunnel insulation layer pattern 112 to the top gate electrode 124. That is, a portion of the bottom gate electrode 122 adjacent the tunnel insulation layer pattern 112 may have higher carbon concentration than a portion adjacent the top gate electrode 124.

If a grain size of the bottom gate electrode 122 is decreased by doping carbon into the bottom of the floating gate electrode 120c, oxidization of the bottom gate electrode 122 can be suppressed through a grain boundary at the edge portion of the bottom gate electrode 122 contacting the tunnel insulation layer pattern 112. Accordingly, an increase in the thickness of the tunnel insulation layer patter 112 may be prevented. That is, a nonvolatile memory device according to some embodiments of the present invention may have the tunnel insulation layer pattern 112 of a uniform thickness.

The gate interlayer insulating layer pattern 132 may insulate the floating gate electrode 120c from the control gate electrode 142. Some embodiments provide that the gate interlayer insulation layer pattern 132 may conformally cover the top of the floating gate electrode 120c. That is, the gate interlayer insulation layer pattern 132 may cover the top and both sidewalls of the top gate electrode 124. Then, the gate interlayer insulation layer pattern 132 may cover the top of the device isolation layer 104 and may extend to the adjacent top gate electrode 124. Accordingly, a contact area of the floating gate electrode 120c and the gate interlayer insulation layer pattern 132 may be increased, and thereby increasing a coupling ratio between the control gate electrode 142 and the floating gate electrode 120c. In addition, since the device isolation layer 104 is disposed substantially the same as or higher than the top of the bottom gate electrode 122, the gate interlayer insulation layer pattern 132 may not contact the carbon doped bottom gate electrode 122. Moreover, if the top of the device isolation layer 104 is recessed, the gate interlayer insulation layer pattern 132 may be conformally formed along the top of the recessed device isolation layer 104.

Furthermore, the gate interlayer insulation layer pattern 132 may be formed of a dielectric layer of a high permittivity, and in order to improve permittivity, may have a laminated structure of a bottom oxide layer/a nitride layer/a top oxide layer. The bottom and top oxide layers may be formed of a metal oxide such as $Al_2O_3$, $HfO_2$, $ZrO_2$, $La_2O_3$, $Ta_2O_3$, $TiO_2$, $SrTiO_3$(STO), $(Ba,Sr)TiO_3$(BST) and the nitride layer may be formed of a silicon nitride layer (i.e., $Si_xN_y$ (x and y are positive integers)).

The control gate electrode 142 may be formed on the gate interlayer insulation layer pattern 132 such that a voltage of the floating gate electrode 120c may be maintained. The control gate electrode 142 may cross over the active region of the semiconductor substrate 100. In embodiments providing that the top of the device isolation layer 104 is recessed, a portion of the control gate electrode 142 may be formed between the bottom gate electrodes 122. Since the control gate electrode 142 is filled in a portion where the device isolation layer 104 is recessed, interference between adjacent floating gates can be suppressed.

An oxide layer may be thinly formed on the surface of the gate structure 150 and the surface of the semiconductor substrate 100 to cure etching damage. Impurity regions 170 may be formed in active regions at the both sides of the gate structure 150 and a channel region may be formed between the impurity regions 170 as a predetermined voltage is applied to the control gate electrode 142.

Figure 3:
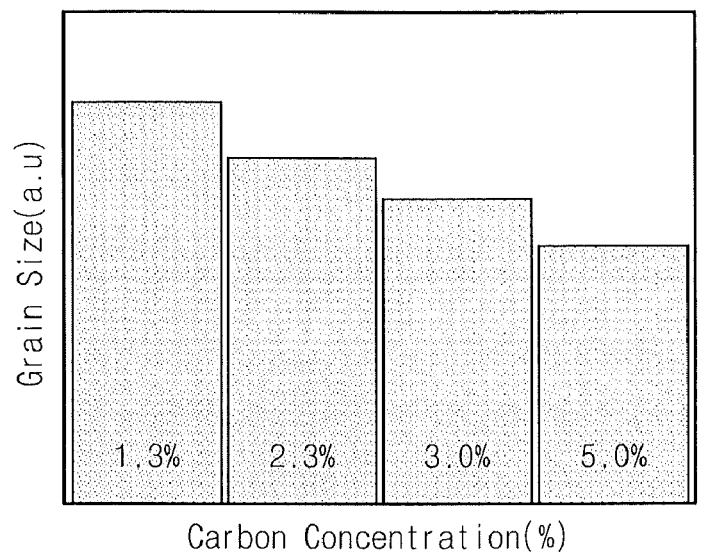
FIG. 3 is a graph illustrating a change of a grain size according to carbon concentration in a polysilicon layer.
Figure 4:
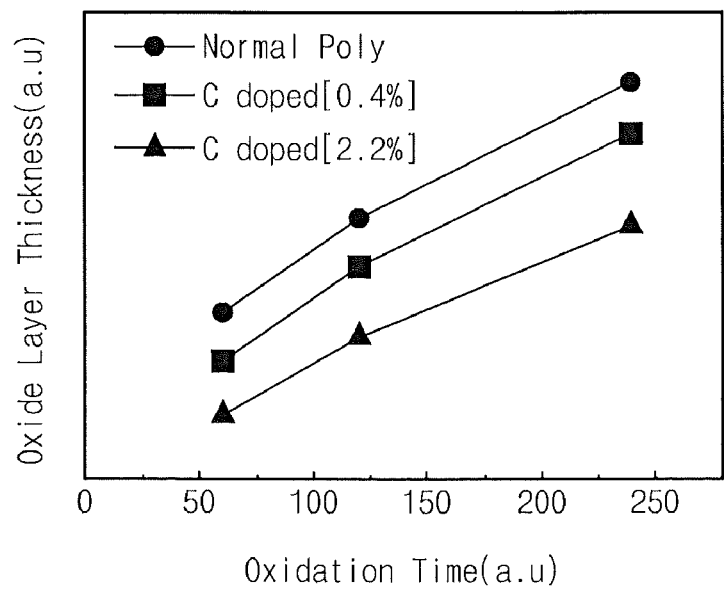
FIG. 4 is a graph illustrating oxidation resistance of a carbon doped polysilicon layer.

FIG. 3 is a graph illustrating a change of a grain size according to carbon concentration in a polysilicon layer. FIG. 4 is a graph illustrating oxidation resistance of a carbon doped polysilicon layer.

FIG. 3 illustrates a grain size of the polysilicon layer after a thermal treatment process is performed on polysilicon layers having respectively different carbon doping concentrations for about 1 min at about 950° C. Referring to FIG. 3, as carbon concentration doped in the polysilicon layer is increased, its grain size is gradually decreased.

In FIG. 4, after a rapid thermal oxidation (RTO) process of about 1000° C. is performed on the polysilicon layers having respectively different carbon doping concentrations, a thickness of the oxide layer is measured. Referring to FIG. 4, according to carbon concentration doped in the polysilicon layer, thickness of the oxide layer formed through the RTO process may vary. For example, as carbon doping concentration is increased, thickness of the oxide layer is decreased.

That is, referring to FIGS. 3 and 4, in order not to increase the tunnel insulation layer by oxidization of the polysilicon layer, a grain size of the polysilicon may be deceased by increasing carbon doping concentration at a portion contacting the tunnel insulation layer. In addition, oxidization of the bottom gate electrode may be suppressed by increasing carbon doping concentration in the bottom gate electrode and thus an increase of the tunnel insulation layer may be prevented.

Figure 5A:
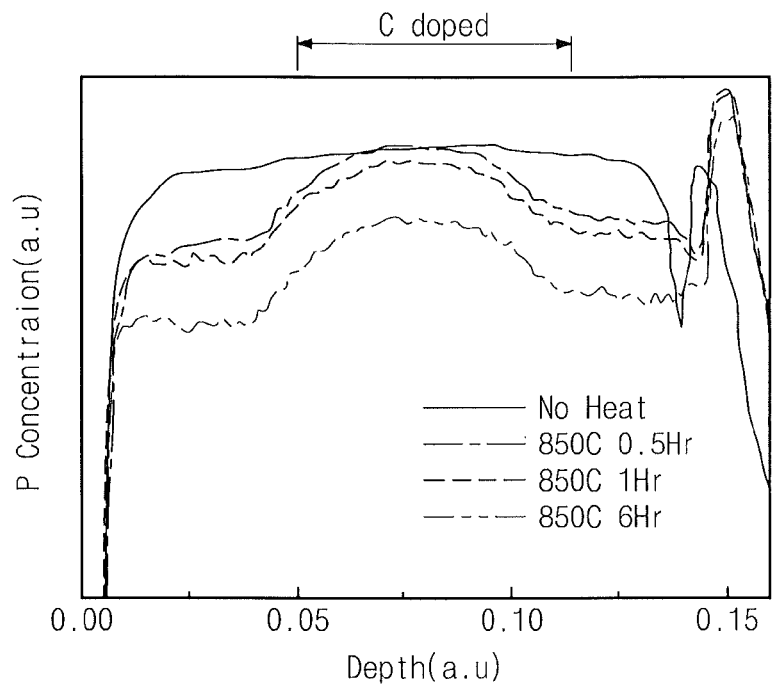
FIGS. 5A and 5B are graphs illustrating impurity diffusion in a carbon doped polysilicon layer.
Figure 5B:
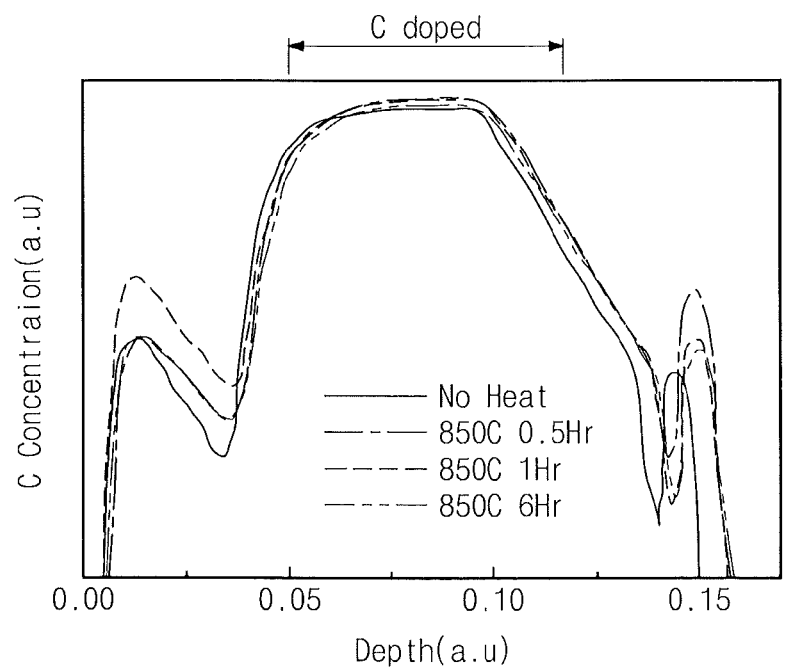

FIGS. 5A and 5B are graphs illustrating impurity diffusion in a carbon doped polysilicon layer. In FIGS. 5A and 5B, a thermal treatment process is performed on a laminated structure of carbon undoped poly-Si/carbon doped poly-Si/carbon undoped poly-Si and a concentration change of phosphorus P and carbon C is measured according to time elapse.

Referring to FIG. 5A, phosphorus diffusion is more suppressed in the carbon doped polysilicon layer, compared to the carbon undoped polysilicon, That is, if a bottom gate electrode is formed of a carbon doped polysilicon layer, phosphorus diffusion is reduced during a high temperature process, such that electrical property of the floating gate electrode can be improved. In addition, referring to FIG. 5B, carbon diffusion occurs less than phosphorus diffusion during a thermal treatment process of a high temperature. That is, carbon concentration in a polysilicon layer may be substantially uniformly maintained during the thermal treatment process of a high temperature.

Hereinafter, referring to FIGS. 6 to 11, a manufacturing method of a nonvolatile memory device according to some embodiments of the present invention will be described. FIGS. 6 to 11 illustrate sequentially the manufacturing method of a nonvolatile memory device according to some embodiments of the present invention.

Referring to FIG. 6, a tunnel insulation layer 110 and a conductive layer for a floating gate 120a are formed on a semiconductor substrate 100.

The semiconductor substrate 100 may be a bulk silicon substrate, a silicon on insulator (SOI) substrate, a germanium substrate, a germanium on insulator (GOI), a silicon-germanium substrate, and/or a substrate of an epitaxial thins layer formed through selective epitaxial growth (SEG), among others.

The tunnel insulation layer 110 may be formed of a silicon oxide layer SiO2 through a thermal process, for example. In addition, the tunnel insulation layer 110 may be formed of a high permittivity material such as $Al_2O_3$, $HfO_2$, $ZrO_2$, $La_2O_3$, $Ta_2O_5$, $TiO_2$, $SrTiO_3$(STO), $(Ba,Sr)TiO_3$(BST), or a composite layer where a combination thereof is stacked. Some embodiments provide that the tunnel insulation layer 110 may be formed using a chemical vapor deposition (CVD) or an atomic layer deposition (ALD) method.

The conductive layer for a floating gate 120a may be formed by continuously depositing a conductive layer for a bottom gate 121 and a conductive layer for a top gate 123. Specifically, the conductive layer for a bottom gate 121 may be formed by depositing a polysilicon layer on the surface of the tunnel insulation layer 110 and dopant such as phosphorus and/or boron may be doped during the deposition of the polysilicon layer. In addition, during the forming of the conductive layer for a bottom gate 121 on the tunnel insulation layer 110, carbon is in-situ doped in polysilicon by providing carbon source gas. The carbon source gas may use $C_2H_4$ or $CH_3SiH_3$, for example. Carbon concentration in a polysilicon layer may be controlled by a supply time and supply amount of the carbon source gas. For example, carbon concentration in a polysilicon layer may be adjusted within a range of about 0.1% to about 20%. Moreover, carbon concentration may be uniform in a polysilicon layer and/or may be gradually increased (or, decreased) from the bottom to the top of the polysilicon layer. By forming the conductive layer for a bottom gate 121 using the carbon doped polysilicon, a grain size of the polysilicon may be reduced.

The conductive layer for a top gate 123 may be continuously formed on the carbon doped conductive layer for a bottom gate 121. That is, by stopping the supply of carbon source gas supplied during the forming of the conductive layer for a bottom gate 121 and in-situ depositing an impurity doped polysilicon layer, the conductive layer for a top gate 123 may be formed. A grain size of the carbon undoped conductive layer for a top gate 123 may be greater than that of the conductive layer for a bottom gate 121.

In addition, the conductive layer for a bottom gate 121 may be formed of doping carbon in the conductive layer for a bottom gate 121 through an ion implantation process after the depositing of a polysilicon layer. Next, by depositing a polysilicon layer on the conductive layer for a bottom gate 121, the conductive layer for a top gate 123 may be formed. At this point, carbon may be undoped in the conductive layer for a top gate 123.

Figure 7:
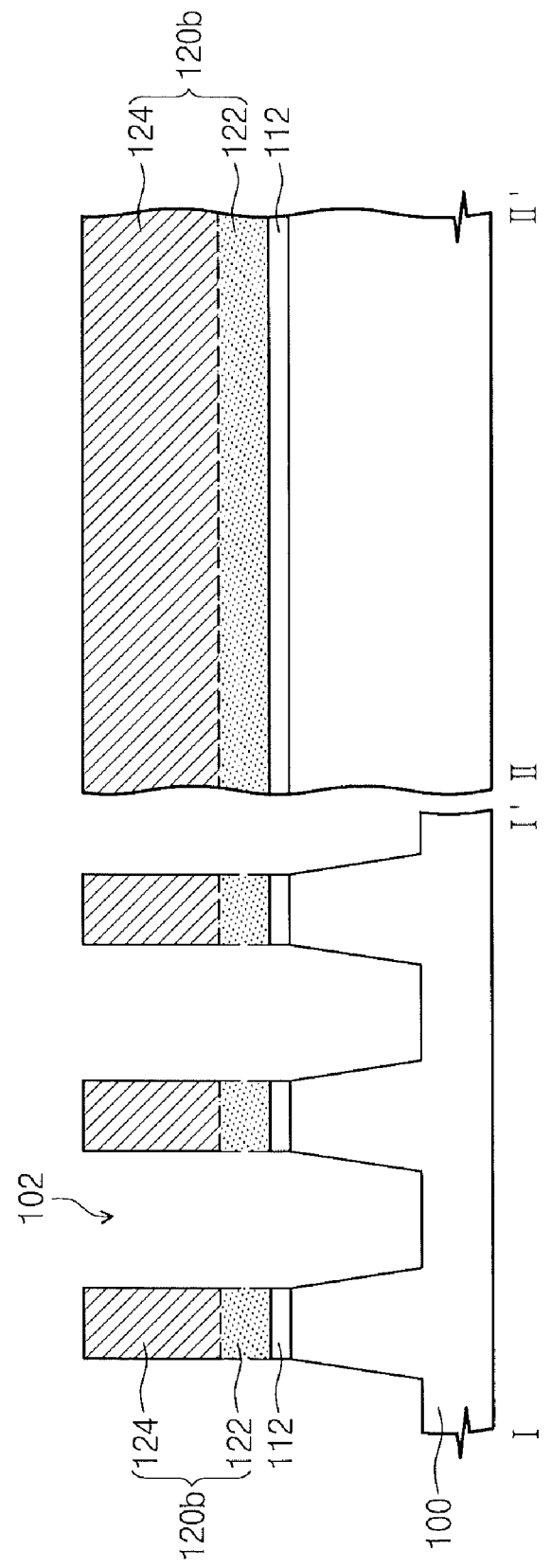

Referring to FIG. 7, a mask pattern (not shown) is formed on the conductive layer for a floating gate 120a and a trench 102 for defining an active region on the semiconductor substrate 100 is formed using the mask pattern as an etching mask. The trench 102 may be formed with a line shape, and may have a sidewall profile in which its width becomes narrower as it approaches to the bottom due to a characteristic of an isotropic etching process. As the trench 102 is formed, a tunnel insulation pattern 112 and a floating gate pattern 120b may be formed on an active region of the semiconductor substrate 100. The floating gate pattern 120b may include the bottom gate electrode 122 and the top gate electrode 124.

Figure 8:
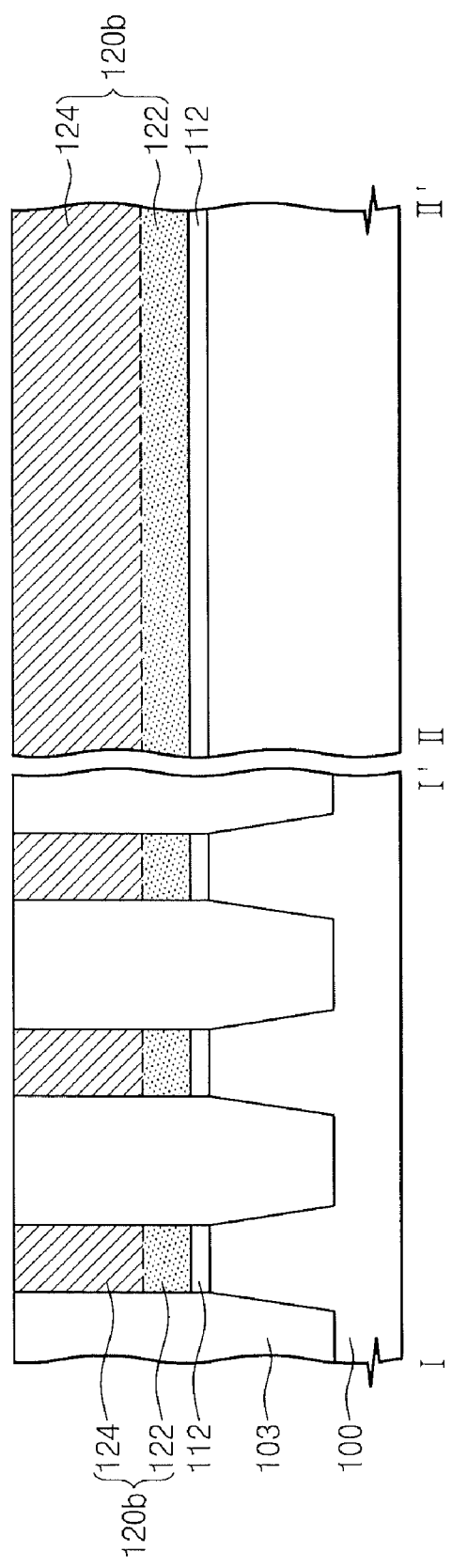

Next, the mask pattern (not shown) may be removed from the floating gate pattern 120b and an insulation layer 103 may be formed in the trench 102 as shown in FIG. 8.

In more detail, an insulation layer for filling the trench 102 may be deposited on the semiconductor substrate 100. At this point, the insulation layer may use Undoped Silicate Glass (USG), tetra-ethyl-ortho-silicate (TEOS) and/or High Density Plasma (HDP) oxide layer, among others. Next, the insulation layer may be planarized until the top of the floating gate pattern 120b is exposed, such that the insulation layer 103 may be filled in the trench 102.

Figure 9:
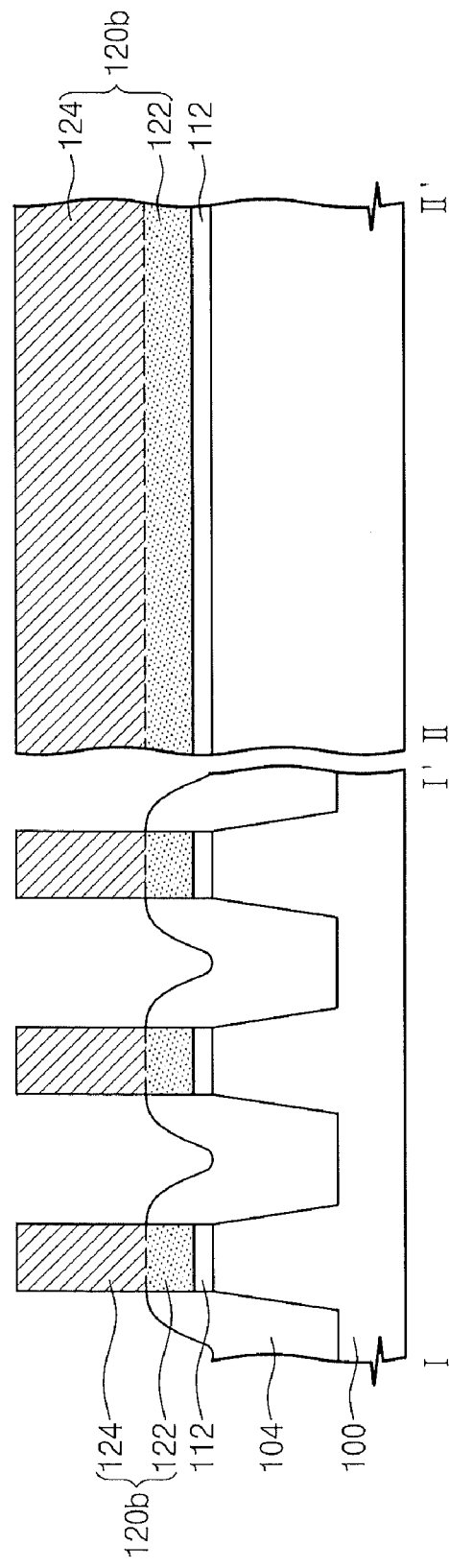

Referring to FIG. 9, during the following process (e.g., a thermal oxidation process), the top of the insulation layer 103 may be recessed in order not to expose the tunnel insulation layer pattern 112 and the bottom gate electrode 122. By exposing the sidewall of the top gate electrode 124 through the process for recessing a top of the insulation layer 103, a contact region between the gate interlayer insulation layer 130 and the floating gate pattern 120b may be increased. In more detail, the sidewall of the top gate electrode 124 may be exposed by isotropic or anisotropic etching the top of the insulation layer 103 filled in the trench 102. Accordingly, a device isolation layer 104 may be formed in the semiconductor substrate 100 and the sidewall of the bottom gate electrode 122 may be covered by the device isolation layer 104. In addition, while the top of the insulation layer 103 is recessed through an anisotropic etching process, the middle portion of the device isolation layer 104 may be depressed. That is, a portion of the device isolation layer 104 between the bottom gate electrodes 122 may be removed. Moreover, while the top of the device isolation layer 104 is recessed, the edge portions of the floating gate pattern 120b may be rounded.

Figure 10:
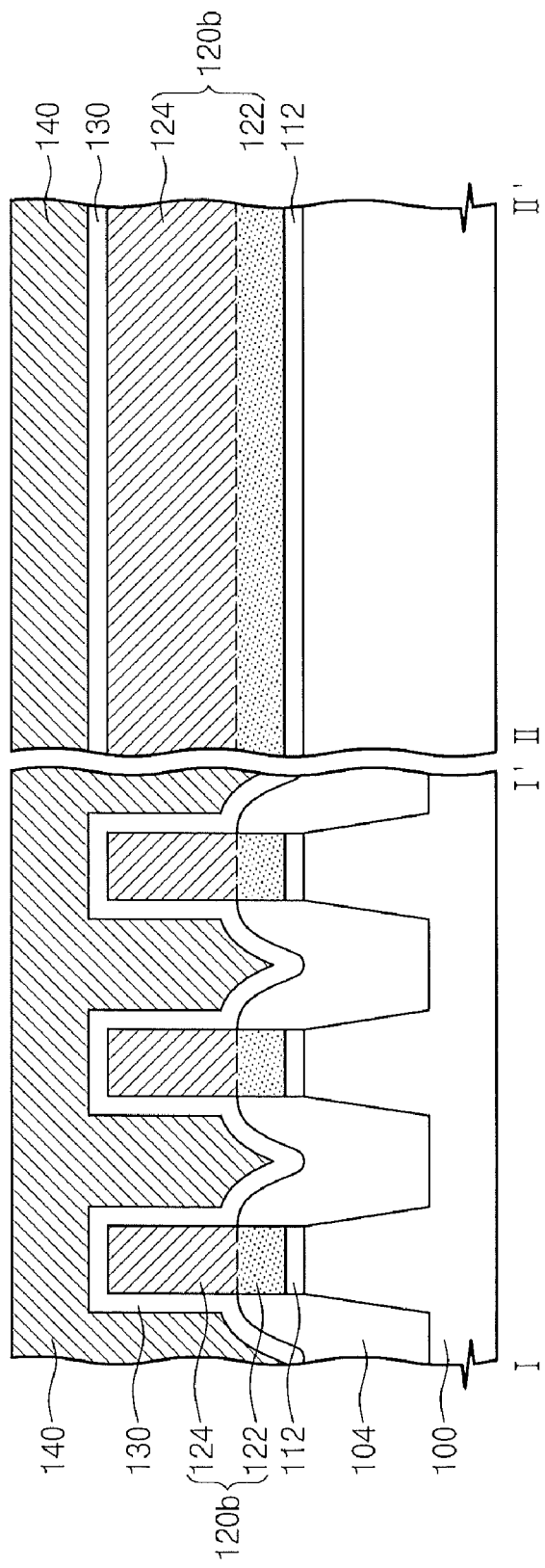

Referring to FIG. 10, the gate interlayer insulation layer 130 and a conductive layer for a control gate 140 are sequentially and conformally formed along the surface of the floating gate pattern 120b and the surface of the device isolation layer 104. Here, the gate interlayer insulation layer 130 may be formed of a thermal oxidation layer, a high permittivity material such as $Al_2O_3$, $HfO_2$, $ZrO_2$, $La_2O_3$, $Ta_2O_5$, $TiO_2$, $SrTiO_3$(STO), and $(Ba,Sr)TiO_3$(BST), or a composite layer where a combination thereof is stacked. Moreover, the gate interlayer insulation layer 130 may be formed by sequentially stacking a silicon oxide layer, a silicon nitride layer and a silicon oxide layer. Then, the conductive layer for a control gate 140 may be formed by depositing polysilicon doped with impurity.

Figure 11:
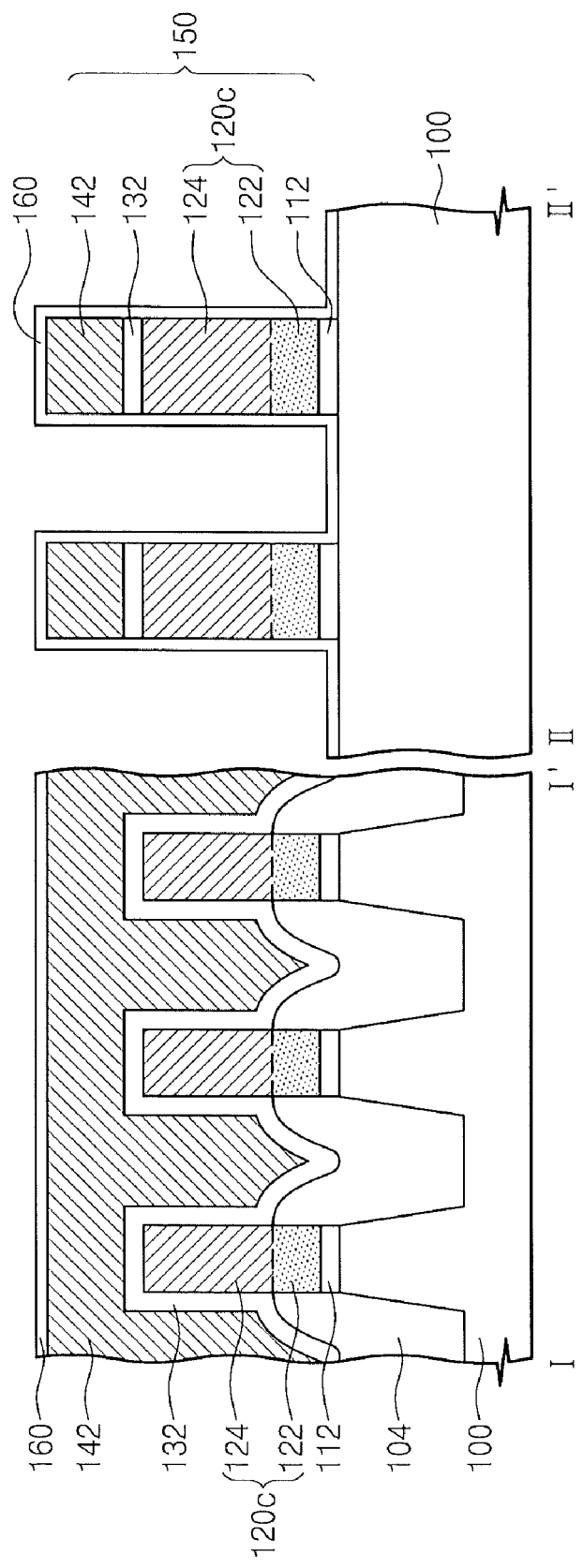

Referring to FIG. 11, the gate structure 150 is formed on the semiconductor substrate 100 by patterning the tunnel insulation layer pattern 112, the floating gate pattern 120b, the gate interlayer insulation layer 130, and the conductive layer for a control gate 140, which are stacked on the semiconductor substrate 100. The gate structure 150 may be formed by forming a mask pattern (not shown) crossing over an active region on the conductive layer for a control gate 140 and then anisotropic-etching the tunnel insulation layer pattern 112, the floating gate pattern 120b, the gate interlayer insulation layer 130, and the conductive layer for a control gate 140 using the mask pattern.

As the gate structure 150 is formed, the control gate electrode 142 crossing over an active region may be formed and the tunnel insulation layer pattern 112 and the floating gate electrode 120c may be locally formed on the active region.

In addition, as the gate structure 150 is formed through an isotropic etching process, the surface of the gate structure 150 may be damaged. That is, a silicon dangling defect may occur on the surface of the gate structure 150. Accordingly, in order to cure the etching damage of the gate structure 150, an oxidation process may be performed, such that as shown in FIG. 11, the oxide layer 160 may be formed along the surface of the semiconductor substrate 100 and the surface of the gate structure 150. As an oxidation process for curing the etching damage of the gate structure 150, a rapid thermal oxidation or O2 plasma processing process may be performed.

In addition, during an oxidation process for the gate structure 150, the side of the floating gate electrode 120c formed of polysilicon may be oxidized. However, since a grain size of polysilicon is small by doping carbon in the bottom gate electrode 122 of the floating gate electrode 120c, oxidation of the bottom gate electrode 122 due to grain boundary may be suppressed. In addition, since binding energy of silicon-carbon (Si—C) is greater than that of silicon-silicon (Si—Si) in the bottom gate electrode 122 of the floating gate electrode 120c (i.e., carbon doped polysilicon layer), binding of silicon Si and oxygen O is interrupted. Accordingly, during an oxidation process for the gate structure 150, oxidation of the bottom gate electrode 122 that contacts the tunnel insulation layer pattern 112 may be suppressed. Therefore, after an oxidation process for curing the etching damage of the gate structure 150, the thickness of the tunnel insulation layer pattern 112 may be uniformly maintained.

After the forming of the oxide layer 160 on the surface of the gate structure 150, as shown in FIG. 2, an impurity region 170 may be formed by ion-implanting impurity on active regions at both sides of the gate structure 150.

In addition, according to some embodiments of the present invention, it is described that after the forming of the floating gate pattern 120b, the device isolation layer 104 is formed. Some embodiments provide that after the forming of the device isolation layer, the floating gate pattern may be formed. Hereinafter, referring to FIGS. 12 to 14, further embodiments of the present invention will be described.

Figure 12:
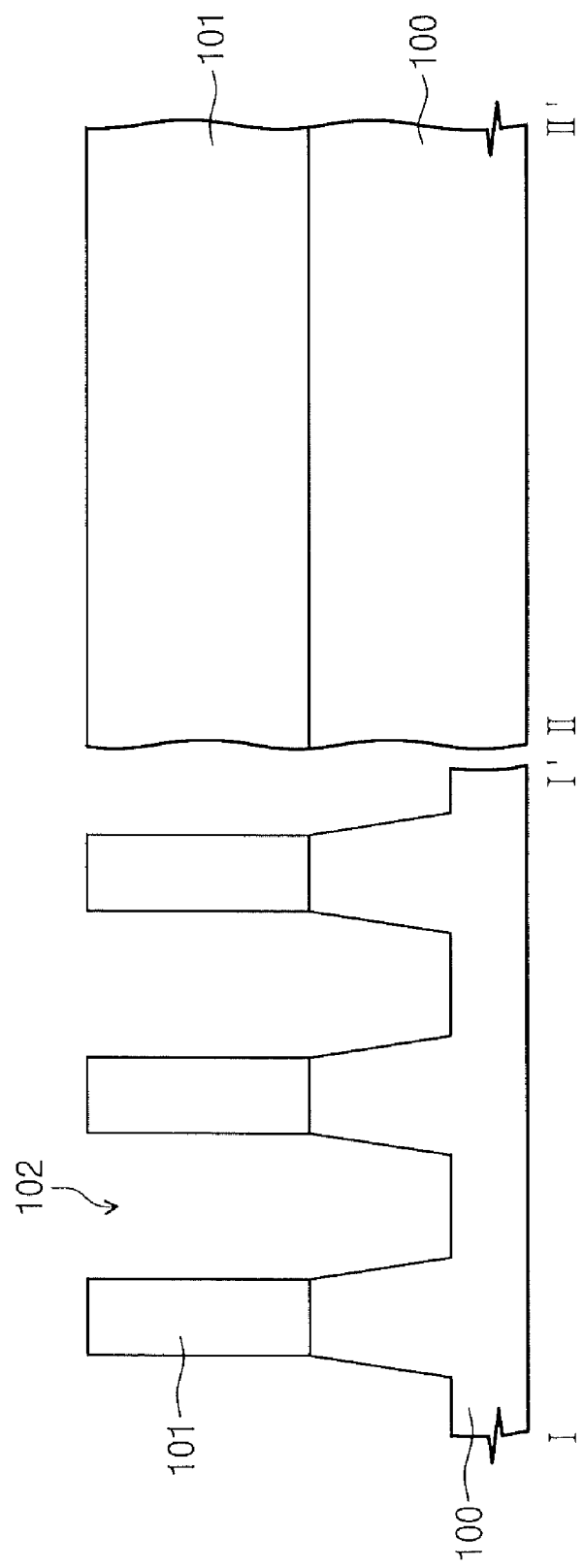
FIGS. 12 to 14 are sectional views of a nonvolatile memory device according to some embodiments of the present invention and illustrate sections taken along the lines I-I' and II-II' of FIG. 1.
Figure 13:
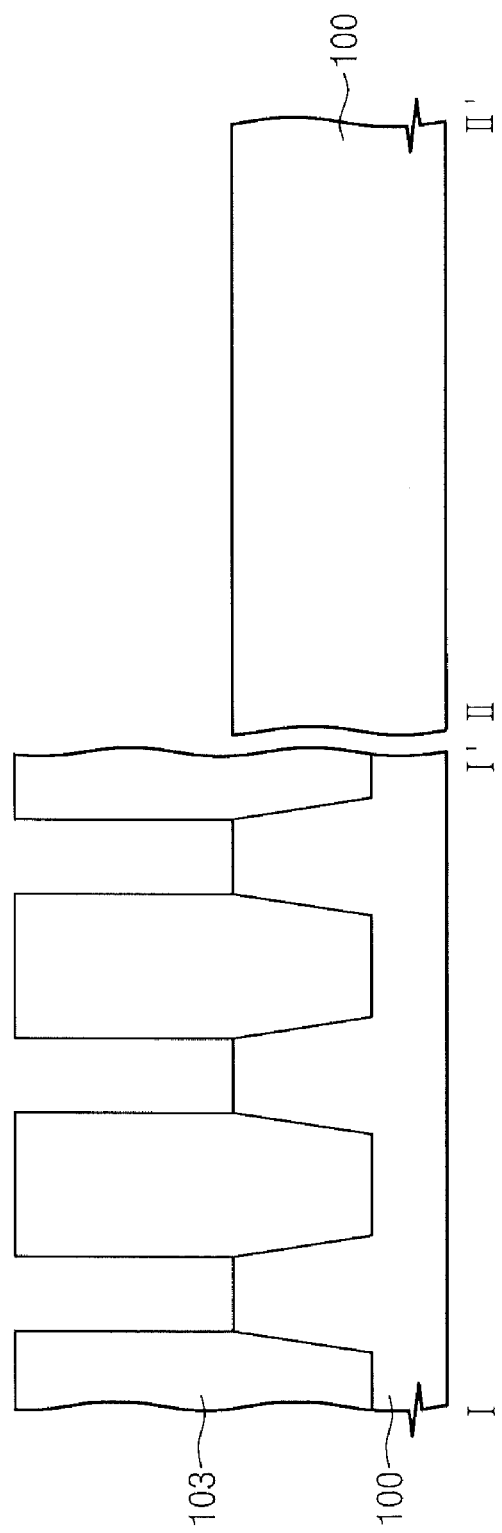
Figure 14:
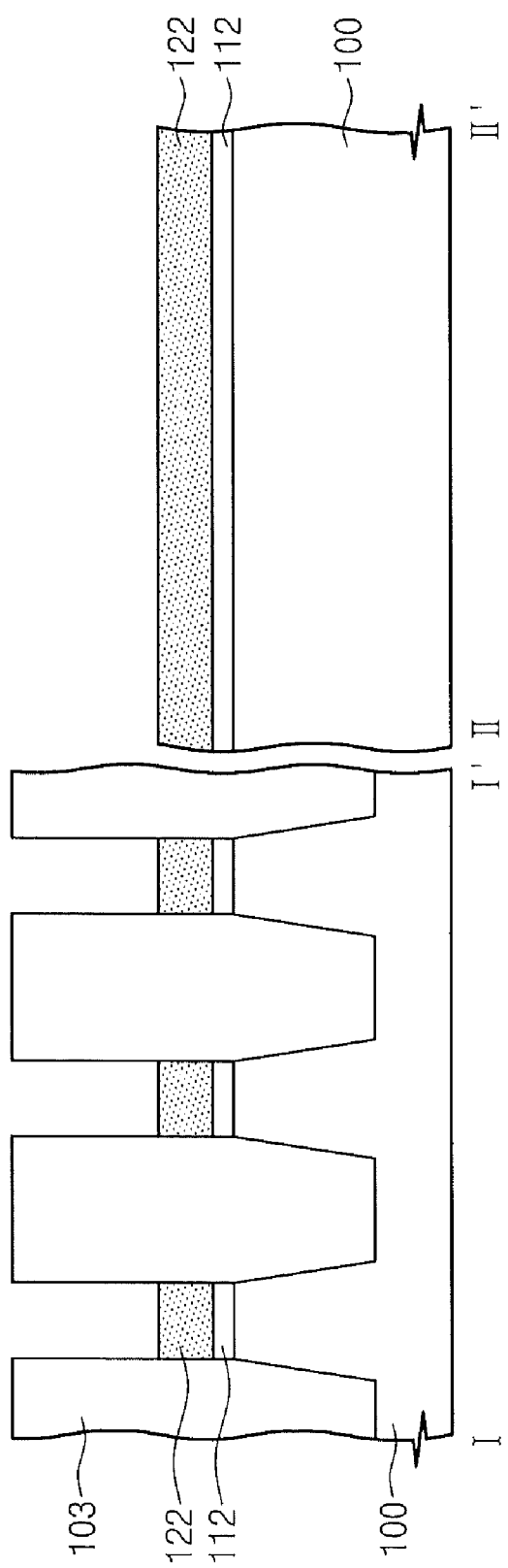

FIGS. 12 to 14 are sectional views of a nonvolatile memory device according to further embodiments of the present invention and illustrate sections taken along the lines I-I' and II-II' of FIG. 1.

Referring to FIG. 12, a mask pattern 101 is formed on a semiconductor substrate 100 to define an active region. The mask pattern 101 may be formed by patterning a silicon nitride layer and a pad oxide layer (not shown) may be formed in order for surface processing of the semiconductor substrate 100 before the forming of the silicon nitride layer on the semiconductor substrate 100. Some embodiments provide that a photoresist layer may be used as the mask pattern 101.

Next, a trench 102 of a predetermined depth may be formed in the semiconductor substrate 100 by etching the semiconductor substrate 100 using the mask pattern 101. The trench 102 may have a line shape extending in one direction. In addition, since the surface of the trench 102 may be damaged during an etching process for forming the trench 102, a thermal treatment process may be performed after the forming of the trench 102. Accordingly, a silicon oxide layer (not shown) may be formed in a trench inner wall.

Referring to FIG. 13, after filling an insulation material in the trench 102, a device isolation layer 104 may be formed by removing the mask pattern 101. The device isolation layer 104 may protrude from the surface of the semiconductor substrate 100 by the mask pattern 101.

Referring to FIG. 14, a tunnel insulation layer 112 and a bottom gate electrode 122 are formed on an active region of the semiconductor substrate 100. The tunnel insulation layer pattern 112 may be thinly formed on the surface of the active region through a thermal oxidation process. The bottom gate electrode 122 may be formed by depositing a polysilicon layer and during the depositing of the polysilicon layer, an n-type or p-type dopant and carbon may be doped. After depositing the carbon doped polysilicon layer, a recess process may be performed to leave a polysilicon layer of a predetermined thickness on an active region, i.e., between the device isolation layers 104. Accordingly, the carbon doped bottom gate electrode 122 may be formed between the device isolation layers 104.

Next, as shown in FIG. 8, the top gate electrode 124 may be formed on the bottom gate electrode 122. An electrode for a top gate 124 may be formed by depositing a polysilicon layer to completely fill between the device isolation layers 104 and then planarizing the polysilicon layer until the surface of the device isolation layer 104 is exposed. Accordingly, a floating gate pattern 120b, where the bottom gate electrode 122 and the top gate electrode 124 are stacked, may be formed on the active region.

Next, as described with reference to FIGS. 9 to 11 according to some embodiments of the present invention, in order to increase a contact region of the floating gate electrode and the gate interlayer insulation layer, the device isolation layer 104 between the floating gate patterns 120b may be recessed. Accordingly, the device isolation layer 104 protruding from the semiconductor substrate 100 and covering the sidewall of the bottom gate electrode 122 may be formed. In addition, during the recessing of the top of the device isolation layer 104 through an anisotropic etching process, the middle portion of the device isolation layer 104 may be depressed. That is, a portion of the device isolation layer 104 between the bottom gate electrodes 122 may be removed. Moreover, while the top of the device isolation layer 104 is recessed, the edge portions of the floating gate pattern 120b may be rounded. Next, the gate interlayer insulation layer 130 and the conductive layer for a control gate 140 may be sequentially and conformally formed along the surface of the floating gate pattern 120b and the surface of the device isolation layer 104.

A gate structure 150 may be formed on the semiconductor substrate 100 by patterning the tunnel insulation layer pattern 112, the floating gate pattern 120b, the gate interlayer insulation layer 130, and the conductive layer for a control gate 140, which are stacked on the semiconductor substrate 100. By performing an oxidation process for curing the etching damage of the gate structure 150, as shown in FIG. 11, the oxide layer 160 may be formed along the surface of the semiconductor substrate 100 and the surface of the gate structure 150. Since carbon is doped in the bottom gate electrode 122, during the forming of the oxide layer 160 through a thermal process, the thickness increase of the bottom gate electrode 122 and the tunnel insulation layer pattern 122 may be suppressed. Next, impurity regions 170 (FIG. 2) may be formed in active regions at the both sidewalls of the gate structure 150.

Moreover, according to yet further embodiments of the present invention, after the forming of the device isolation layer 104 in the semiconductor substrate 100, the bottom and top gate electrodes 122 and 124 may be formed by continuously depositing the carbon doped conductive layer for a bottom gate 121 and the carbon undoped conductive layer for a top gate 123 and then patterning the conductive layer for a bottom gate 121 and the conductive layer for a top gate 123. In this case, a portion of the top gate electrode 124 may be formed on the device isolation layer 104 and the width of the top gate electrode 124 may be greater than that of the bottom gate electrode 122.

Figure 15:
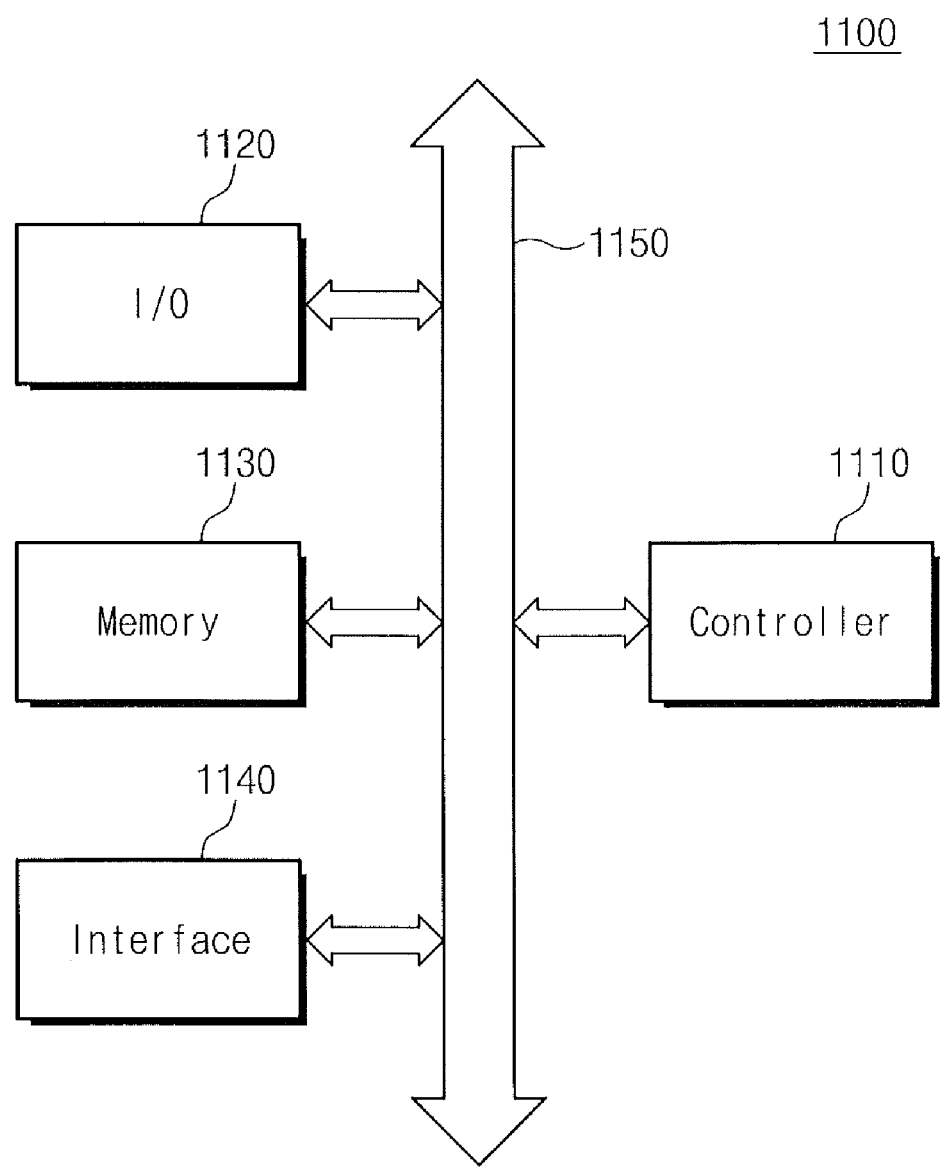
FIG. 15 is a schematic view of a memory system including a nonvolatile memory device according to some embodiments of the present invention.

FIG. 15 is a schematic view of a memory system including nonvolatile memory devices according to some embodiments of the present invention. The memory system 1100 may be applied to a personal digital assistant (PDA), a portable computer, a web tablet, a wireless phone, a mobile phone, a digital music player, a memory card, and/or all kinds of electronic products for transmitting and/or receiving information via a wireless environment.

The memory system 1100 includes a controller 1110, an input/output device 1120 such as a keypad, a keyboard, and a display, a memory 1130, an interface 1140, and a bus 1150. The memory 1130 may mutually communicate with the interface 1140 through the bus 1150.

The controller 1110 may include at least one microprocessor, a digital signal processor, a microcontroller, and/or other process devices similar thereto. The memory 1130 may be used to store commands executed by the controller 1110. The input/output device 1120 may receive data or signals from the external of the system 1100 or output them to the external of the system 1100. For example, the input/output device 1120 may include a keyboard, a keypad, and/or a display device, among others.

The memory 1130 may include a nonvolatile memory device according to some embodiments of the present invention. The memory 1130 may further include other kinds of memories such as a volatile memory that may be operable for arbitrarily irregular access.

The interface 1140 may transmit data into a communication network and/or receive data from a communication network.

Figure 16:
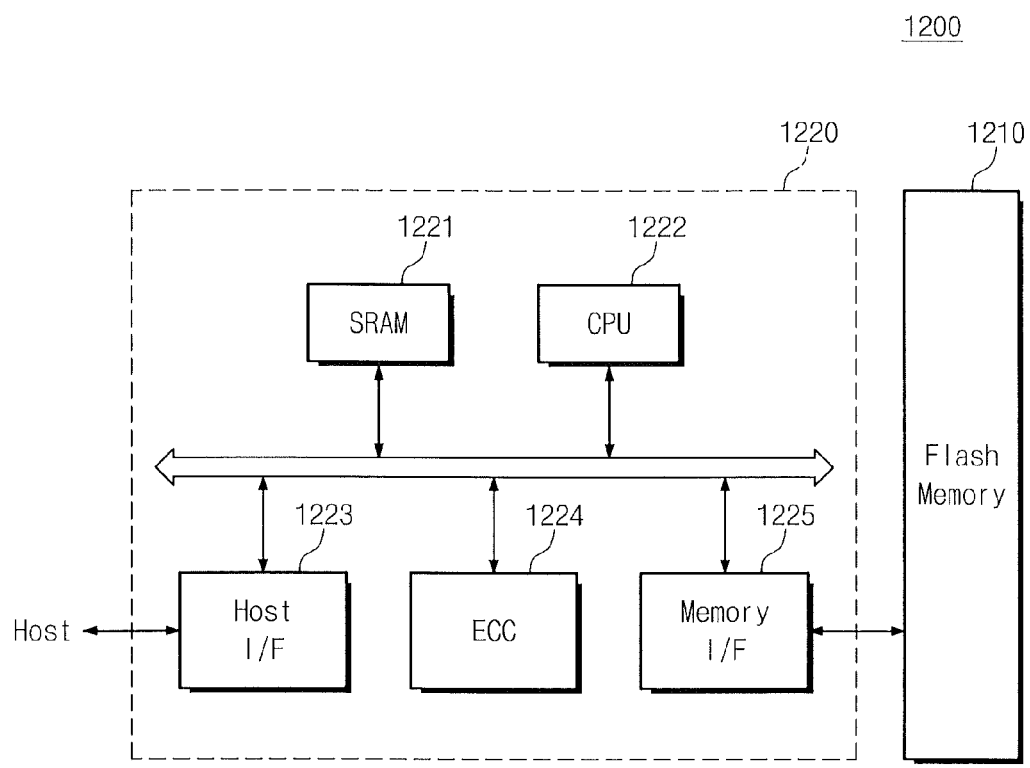
FIG. 16 is a block diagram illustrating a memory card 200 equipped with a flash memory device according to some embodiments of the present invention.

FIG. 16 is a block diagram illustrating a memory card 1200 equipped with a flash memory device according to some embodiments of the present invention. The memory card 1200 for supporting high-capacity data storage may include a flash memory device 1210 according to some embodiments of the present invention. The memory card 1200 according to some embodiments of the present invention may include a memory controller 1210 for controlling general data exchanges between a host and the flash memory device 1210.

A SRAM 1221 may be used as an operating memory of a central processing unit (CPU) 1222. A host interface (I/F) 1223 includes a data exchange protocol of a host connected to the memory card 1200. An error correction code (ECC) block 1224 detects and corrects an error in data read from the multi-bit flash memory device 1210. A memory interface (I/F) 1225 interfaces with the flash memory device 1210. The CPU 1222 performs a general control operation for data exchange of the memory controller 1220. Although not illustrated in the drawings, it is apparent to those skilled in the art that the memory card 1200 according to some embodiments of the present invention may further include ROM (not shown) for storing code data to interface with a host.

Figure 17:
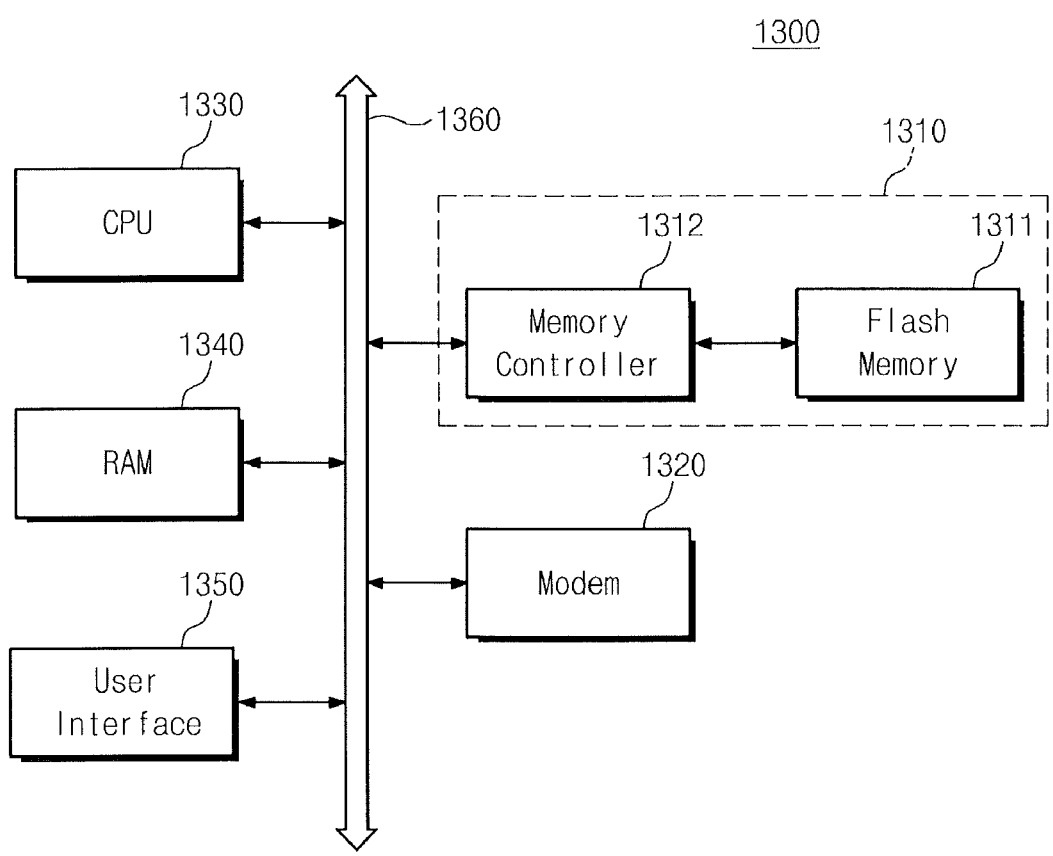
FIG. 17 is a block diagram illustrating an information processing system 1300 equipped with a flash memory system.

Reference is now made to FIG. 17, which is a block diagram illustrating an information processing system 1300 equipped with a flash memory system 1310. A flash memory system 1310 according to some embodiments of the present invention may be mounted on the information processing system 1300 such as a mobile device and/or a desktop computer. The information processing system 1300 may include a flash memory system 1310, a modem 1320, a CPU 1330, a RAM 1340, and a user interface 1350, which are connected via a system bus 1360. The flash memory system 1310 may have the same configuration as the above mentioned memory system or flash memory system. The flash memory system 1310 stores data processed by the CPU 1330 or data inputted from an external. Here, the flash memory system 1310 may include a solid state drive (SSD), and in that case, the information processing system 1300 can stably store a high capacity data in the flash memory system 1310. Moreover, as its reliability is enhanced, the flash memory system 1310 can save a resource consumed for an error correction, such that a high speed data exchange function can be provided to the information processing system 1300. Although not illustrated in the drawings, it is apparent to those skilled in the art that the information processing system 1300 may further include an application chipset, a camera image processor (CIS), and/or an input/output device.

In addition, the flash memory device and/or the memory system according to some embodiments of the present invention may be mounted using various kinds of packages. The various kinds of the packages of the flash memory device and/or the memory system may include Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP), among others.

According to a nonvolatile memory device of the inventive concept, by forming the bottom of a floating gate electrode (that contacts a tunnel insulation layer) by using a carbon doped polysilicon layer, a grain size of the bottom of the floating gate electrode can be reduced. Accordingly, during an oxidation process for curing the surface damage after forming of a gate structure, an increase in the thickness of the tunnel insulation layer as an edge portion of the floating gate electrode (that contacts the tunnel insulation layer) is abnormally oxidized may be prevented. Therefore, during a program or erase operation of a nonvolatile memory device, since an increase in the trap amount of electrons or electron holes due to the thick tunnel insulation layer may be prevented, charge maintenance property and reliability of the nonvolatile memory device can be improved.

In addition, by doping carbon into a floating gate electrode, thermal stability of the floating gate electrode may be increased and diffusion of an n-type or p-type impurity doped in polysilicon may be suppressed, such that electrical property of a nonvolatile memory device can be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device, comprising:
   a tunnel insulation layer on a semiconductor substrate;
   a floating gate electrode comprising:
      a bottom gate electrode doped with carbon and contacting the tunnel insulation layer; and
      a top gate electrode on the bottom gate electrode;
   a gate interlayer insulation layer on the floating gate electrode; and
   a control gate electrode on the gate interlayer insulation layer,
   wherein a first carbon doping concentration at a portion adjacent the tunnel insulation layer is higher than a second carbon doping at a portion adjacent the top gate electrode, in the bottom gate electrode.

2. The nonvolatile memory device of claim 1, wherein the carbon doped in the bottom gate electrode includes a concentration range of 0.1% to 20%.

3. The nonvolatile memory device of claim 1, wherein the carbon doped in the bottom gate electrode has at least one of a uniform doping concentration or a uniform concentration gradient.

4. The nonvolatile memory device of claim 1, wherein the first carbon doping concentration in the bottom gate electrode is higher than the second carbon doping in the top gate electrode.

5. The nonvolatile memory device of claim 1, wherein the gate interlayer insulation layer is spaced apart from the bottom gate electrode.

6. The nonvolatile memory device of claim 1, further comprising a plurality of device isolation layers defining an active region and protruding from a surface of the semiconductor substrate, wherein the bottom gate electrode is disposed between ones of the plurality of device isolation layers.

7. The nonvolatile memory device of claim 6, wherein a top of the bottom gate electrode is disposed being lower than or identical to a top of one of the plurality of device isolation layers that is adjacent a sidewall of the bottom gate electrode.

8. The nonvolatile memory device of claim 6, wherein a portion of the control gate electrode between the bottom gate electrodes has a lower bottom than the top of the bottom gate electrode.

9. A memory card comprising:
   a nonvolatile memory device according to claim 1; and
   a memory controller that is configured to controlling general data exchanges between a host and the nonvolatile memory device.

* * * * *